(12) United States Patent
Yoshioka et al.

(10) Patent No.: US 7,297,360 B2
(45) Date of Patent: *Nov. 20, 2007

(54) INSULATION FILM (75) Inventors: Mutsuhiko Yoshioka, Tokyo (JP); Eiji Hayashi, Tokyo (JP); Kouji Sumiya, Tokyo (JP); Atsushi Shiota, Tokyo (JP)

(73) Assignee: JSR Corporation, Tokyo (JP)

( * ) Notice: Subject to any disclaimer, the term of this patent is extended or adjusted under 35 U.S.C. 154(b) by 573 days.

This patent is subject to a terminal disclaimer.

(21) Appl. No.: 10/726,666

(22) Filed: Dec. 4, 2003

(65) Prior Publication Data

US 2004/0110896 A1 Jun. 10, 2004

(30) Foreign Application Priority Data

Dec. 6, 2002 (JP) .............................. 2002-354512

(51) Int. Cl.
- *B05D 5/12* (2006.01)
- *H01L 21/31* (2006.01)
- *H01L 21/469* (2006.01)
- *C08G 77/20* (2006.01)

(52) U.S. Cl. .................... 427/96.1; 427/98.8; 438/706; 438/781; 528/32

(58) Field of Classification Search ............... 427/96.1, 427/98.8; 438/706, 781
See application file for complete search history.

(56) References Cited

U.S. PATENT DOCUMENTS

| | | | |
|---|---|---|---|
| 5,602,060 A | | 2/1997 | Kobayashi et al. |
| 5,877,080 A | * | 3/1999 | Aoi et al. .................... 438/622 |
| 6,162,743 A | | 12/2000 | Chu et al. |
| 6,225,238 B1 | * | 5/2001 | Wu .............................. 438/778 |
| 6,489,030 B1 | | 12/2002 | Wu et al. |
| 6,613,834 B2 | * | 9/2003 | Nakata et al. ............... 524/588 |
| 6,614,096 B2 | * | 9/2003 | Kojima et al. .............. 257/635 |
| 2001/0033026 A1 | | 10/2001 | Nakata et al. |
| 2002/0059899 A1 | * | 5/2002 | Seta et al. ..................... 117/97 |
| 2004/0110379 A1 | * | 6/2004 | Yoshioka et al. ............ 438/691 |
| 2004/0247896 A1 | * | 12/2004 | Apen et al. .................. 428/447 |
| 2005/0042538 A1 | * | 2/2005 | Babich et al. ........... 430/270.1 |
| 2006/0275614 A1 | * | 12/2006 | Shiota ........................ 428/447 |
| 2007/0020467 A1 | * | 1/2007 | Nakagawa et al. ......... 428/447 |
| 2007/0027287 A1 | * | 2/2007 | Akiyama et al. ............. 528/35 |

FOREIGN PATENT DOCUMENTS

| | | |
|---|---|---|
| JP | 7-90085 | 4/1995 |
| JP | 7-102069 | 4/1995 |
| JP | 9-143271 | 6/1997 |
| JP | 10-120689 | 5/1998 |
| JP | 10-204181 | 8/1998 |
| JP | 10-298292 | 11/1998 |
| JP | 11-29579 | 2/1999 |
| JP | 11-158187 | 6/1999 |
| JP | 2002-309088 | 10/2002 |
| JP | 2003-297820 | 10/2003 |

\* cited by examiner

*Primary Examiner*—Tae H Yoon
(74) *Attorney, Agent, or Firm*—Oblon, Spivak, McClelland, Maier & Neustadt, P.C.

(57) ABSTRACT

An insulation film comprising an organosilicon polymer and an organic polymer such as polyarylene, polyarylene ether, polyimide, and fluororesin is disclosed, wherein the organosilicon polymer has a relative dielectric constant of 4 or less and has a dry etching selection ratio of 1/3 or less to silicon oxide, fluorine-doped silicon oxide, organosilicate glass, carbon-doped silicon oxide, methyl silsesquioxane, hydrogen silsesquioxane, a spin-on-glass, or polyorganosiloxane. The insulation film is used as an etching stopper or a hard mask in a dry etching process of interlayer dielectric films for semiconductors and can produce semiconductors having excellent precision with minimal damages.

15 Claims, 2 Drawing Sheets

INSULATION FILM

BACKGROUND OF THE INVENTION

1. Field of the Invention

The present invention relates to an insulation film, etching stopper, and hard mask. More particularly, the present invention relates to an insulation film, etching stopper, and hard mask preferably used in a dry etching process of interlayer dielectric films made of a material such as $SiO_2$, fluorine-doped $SiO_2$, organic or inorganic SOG (spin-on glass), or Low-k films or a dry etching process of barrier films such as SiN films, SiC films, or SiCN films in the manufacture of semiconductor devices.

2. Description of Background Art

Conventionally, interlayer dielectric films, barrier films, and the like used in the manufacture of semiconductor devices have been processed by dry etching using a halogen-containing gas as a major component. SiN (silicon nitride) films, SiC (silicon carbide) films, SiCN (carbonized silicon nitride) films, and the like formed by plasma CVD are mainly used as a hard mask or etching stopper for $SiO_2$ materials, fluorine-doped $SiO_2$ materials, organic or inorganic SOG (spin-on glass) materials, low dielectric interlayer dielectric films, and the like. These types of hard masks and etching stoppers have a high dielectric constant of 4 or more. If applied to high-speed devices that are processed in combination with the technique of low dielectric interlayer dielectric films such as FSG (fluorine-doped $SiO_2$) films, OSG (organo silica glass) films, and porous Low-k films and the copper wiring technique, these hard masks and etching stoppers have been reported to require a high actual dielectric constant for the dielectric layer that makes it difficult to improve delayed transmission and the like (for example, Japanese Patent Application Laid-open No. 2002-76115). Therefore, development of a material having a dielectric constant of less than 4 and exhibiting a high etching selection ratio to materials such as $SiO_2$, fluorine-doped $SiO_2$, organic or inorganic SOG (spin-on glass) material, Low-k films, and organic or inorganic interlayer dielectric films used with SiN, SiC, or SiCN has been strongly desired.

The present invention has been completed to solve the above problems in the prior art. Specifically, an object of the present invention is to provide a material for thin films effectively functioning as an etching stopper and a hard mask and exhibiting a high etching selection ratio when combined with a silicon oxide-based interlayer dielectric film such as silicon oxide ($SiO_2$), fluorine-doped silicon oxide (FSG), organosilicate glass (OCG), carbon-doped silicon oxide (SiOC), methyl silsesquioxane (MSQ), hydrogen silsesquioxane (HSQ), spin-on-glass (SOG), or polyorganosiloxane or an organic polymer-based interlayer dielectric film made of an organic polymer such as polyarylene, polyarylene ether, polyimide, or fluororesin (hereinafter referred to as "organic polymer (A)") The present invention further provides a method for processing a damascene structure and a dual damascene structure in which the etching stopper or the hard mask is used.

SUMMARY OF THE INVENTION

The above object can be solved in the present invention by an insulation film comprising an organosilicon polymer with a relative dielectric constant of 4 or less having a dry etching selection ratio to the compound selected from the group consisting of silicon oxide, fluorine-doped silicon oxide, organosilicate glass, carbon-doped silicon oxide, methyl silsesquioxane, hydrogen silsesquioxane, a spin-on-glass, polyorganosiloxane, and an organic polymer selected from the group consisting of polyarylene, polyarylene ether, polyimide, and fluororesin.

In the above insulation film, the dry etching selection ratio is preferably 1/3 or less.

In the above insulation film, the organosilicon polymer is preferably a polycarbosilane.

In the above insulation film, the organosilicon polymer is at least one polymer selected from the group consisting of polymers having the structural unit of the following formula (1), (1)

wherein $R^1$ and $R^2$ independently represent a hydrogen atom, an alkyl group having 1-30 carbon atoms that may have a substituent, an alkenyl group having 1-30 carbon atoms that may have a substituent, an alkynyl group having 1-30 carbon atoms that may have a substituent, or an aromatic group that may have a substituent and $R^3$ represents —C≡C—, —$CH_2$— that may have a substituent linked with at least one —C≡C— group, an alkylene group having 2-30 carbon atoms that may have a substituent linked with at least one —C≡C— group, an alkenylene group having 2-30 carbon atoms that may have a substituent linked with at least one —C≡C— group, an alkynylene group having 2-30 carbon atoms that may have a substituent linked with at least one —C≡C— group, or a divalent aromatic group having 2-30 carbon atoms that may have a substituent linked with at least one —C≡C— group.

The above object can be further solved in the present invention by a coating solution composition comprising (I) the above organosilicon polymer and (II) an organic solvent.

The above object is further solved in the present invention by a method of forming an insulating film comprising applying the above coating solution to a substrate and heating the applied composition.

The above object can be further solved in the present invention by a method of forming an insulating film comprising applying the above coating solution composition to a substrate and heating the applied composition in the presence of oxygen or peroxide to three-dimensionally crosslink the composition.

The above object can be further solved in the present invention by an etching stopper comprising the insulation film formed below an upper layer film comprising a compound selected from the group consisting of silicon oxide, fluorine-doped silicon oxide, organosilicate glass, carbon-doped silicon oxide, methyl silsesquioxane, hydrogen silsesquioxane, spin-on glass, and polyorganosiloxane or an upper layer film comprising an organic polymer selected from the group consisting of polyarylene, polyarylene ether, polyimide, and fluororesin and having an etch rate of 1/3 or less of the plasma dry etching rate of the upper layer film.

The above object can be further solved in the present invention by a hard mask comprising the insulation film described in claim 1 formed on an under layer film comprising a compound selected from the group consisting of silicon oxide, fluorine-doped silicon oxide, organosilicate glass, carbon-doped silicon oxide, methyl silsesquioxane, hydrogen silsesquioxane, spin-on glass, and polyorganosiloxane or an under layer film comprising an organic polymer selected from the group consisting of polyarylene, polyarylene ether, polyimide, and fluororesin and having an etch rate of 1/3 or less of the plasma dry etching rate of the under layer film.

The above object can be further solved in the present invention by a method of dry etching an insulation film characterized by using either the above etching stopper or the above hard mask.

The above object can be further solved in the present invention by a damascene structure processing method characterized by using either the above etching stopper or the above hard mask.

The above object can be further solved in the present invention by a dual damascene structure processing method characterized by using either the above etching stopper or the above hard mask.

In the present invention, an insulation film comprising an organosilicon polymer having a relative dielectric constant of 4 or less is used as an etching stopper or a hard mask.

Other objects, features and advantages of the invention will hereinafter become more readily apparent from the following description.

DETAILED DESCRIPTION OF THE INVENTION AND PREFERRED EMBODIMENTS (I) Organosilicon Polymer The insulating film of the present invention comprises an organosilicon polymer having a relative dielectric constant of 4 or less.

Polycarbosilane having a relative dielectric constant of 4 or less, preferably 3.5 or less, can be given as such an organosilicon polymer.

A particularly preferable organosilicon polymer is a polymer (hereinafter referred to as "Polymer (1)") having a recurring unit of the following formula (1):

(1)

wherein $R^1$ and $R^2$ independently represent a hydrogen atom, an alkyl group having 1-30 carbon atoms that may have a substituent, an alkenyl group having 1-30 carbon atoms that may have a substituent, an alkynyl group having 1-30 carbon atoms that may have a substituent, or an aromatic group that may have a substituent and $R^3$ represents —C≡C—, —CH$_2$— that may have a substituent linked with at least one —C≡C— group, an alkylene group having 2-30 carbon atoms that may have a substituent linked with at least one —C≡C— group, an alkenylene group having 2-30 carbon atoms that may have a substituent linked with at least one —C≡C— group, an alkynylene group having 2-30 carbon atoms that may have a substituent linked with at least one —C≡C— group, or a divalent aromatic group having 2-30 carbon atoms that may have a substituent linked with at least one —C≡C— group.

As examples of the alkyl group having 1-30 carbon atoms that may have a substituent represented by $R^1$ or $R^2$, a methyl group, ethyl group, propyl group, hexyl group, cyclohexyl group, octyl group, dodecanyl group, trifluoromethyl group, 3,3,3-trifluoropropyl group, chloromethyl group, aminomethyl group, hydroxymethyl group, silylmethyl group, and 2-methoxyethyl group can be given; as examples of the alkenyl group having 1-30 carbon atoms that may have a substituent, a vinyl group, 2-propenyl group, isopropenyl group, 3-butenyl group, 5-hexenyl group, 1,3-buthadienyl group, and 3,3,3-trifluoro-1-propenyl group can be given; as examples of the alkynyl group having 1-30 carbon atoms that may have a substituent, an ethynyl group, 1-propynyl group, 2-propynyl group, butynyl group, trimethylsilylethynyl group, and phenylethynyl group can be given; and as examples of the aromatic group that may have a substituent, a phenyl group, naphthyl group, pyrazinyl group, 4-methylphenyl group, 4-vinylphenyl group, 4-ethynylphenyl group, 4-aminophenyl group, 4-chlorophenyl group, 4-hydroxyphenyl group, 4-carboxyphenyl group, 4-methoxyphenyl group, and 4-silylphenyl group can be given.

As examples of the —CH$_2$— group that may have a substituent linked with at least one —C≡C— group represented by $R^3$, a methylene group and fluoromethylene group linked with one or two —C≡C— groups can be given; as examples of the alkylene group having 2-30 carbon atoms that may have a substituent linked with at least one —C≡C— group, an ethylene group, propylene group, tetramethylene group, and tetrafluoroethylene group linked with one or two —C≡C— groups can be given; as examples of the alkenylene group having 2-30 carbon atoms that may have a substituent linked with at least one —C≡C— group, a vinylene group, propenylene group, and butadienylene group linked with one or two —C≡C— groups can be given; as examples of the alkynylene group having 2-30 carbon atoms that may have a substituent linked with at least one —C≡C— group, an ethynylene group, propynylene group, and butynylene group linked with one or two —C≡C— groups can be given; and as examples of the aromatic group that may have a substituent linked with at least one —C≡C— group, a phenylene group, naphthylene group, biphenylene group, anthracenylene group, pyridilene group, thiophenylene group, fluorophenylene group, chlorophenylene group, methylphenylene group, silylphenylene group, hydroxyphenylene group, aminophenylene group, phenylene methylene phenylene group, phenylene oxy phenylene group, phenylene propylidene phenylene group, and phenylene(hexafluoropropylidene)phenylene group linked with one or two —C≡C— groups can be given.

The silicon-containing polymer compound represented by the formula (1) used in the present invention is specifically a compound having the following recurring units:
silylene-ethynylene, methylsilylene-ethynylene, phenylsilylene-ethynylene, silylene-ethynylene-1,3-phenylene-ethynylene, silylene-ethynylene-1,4-phenylene-ethynylene, silylene-ethynylene-1,2-phenylene-ethynylene, methylsilylene-ethynylene-1,3-phenylene-ethynylene, methylsilylene-ethynylene-1,4-phenylene-ethynylene, methylsilylene-ethynylene-1,2-phenylene-ethynylene, dimethylsilylene-ethynylene-1,3-phenylene-ethynylene, dimethylsilylene-ethynylene-1,4-phenylene-ethynylene, dimethylsilylene-ethynylene-1,2-phenylene-ethynylene, diethylsilylene-ethynylene-1,3-phenylene-ethynylene, phenylsilylene-ethynylene-1,3-phenylene-ethynylene, phenylsilylene-ethynylene-1,4-phenylene-ethynylene, phenylsilylene-ethynylene-1,2-phenylene-ethynylene, diphenylsilylene-ethynylene-1,3-phenylene-ethynylene, hexylsilylene-ethynylene-1,3-phenylene-ethynylene, vinylsilylene-ethynylene-1,3-phenylene-ethynylene, ethynylsilylene-ethynylene-1,3-phenylene-ethynylene, 2-propenylsilylene-ethynylene-1,3-phenylene-ethynylene, 2-propynylsilylene-ethynylene-1,3-phenylene-ethynylene, trifluoromethylsilylene-ethynylene-1,3-phenylene-ethynylene, 3,3,3-trifluoropropylsilylene-ethynylene-1,3-phenylene-ethynylene, 4-methylphenylsilylene-ethynylene-1,3-phenylene-ethynylene, 4-vinylphenylsilylene-ethynylene-1,3-phenylene-ethynylene, 4-ethynylphenylsilylene-ethynylene-1,3-phenylene-ethynylene, phenylethynylsilylene-ethynylene-1,3-phenylene-ethynylene, silylene-ethynylene(5-methyl-1,3-phenylene)ethynylene, phenylsilylene-ethynylene(5-methyl-1,3-phenylene)-ethynylene, phenylsilylene-ethynylene(5-silyl-1,3-phenylene)-ethynylene, phenylsilylene-ethynylene(5-hydroxy-1,3-phenylene)-ethynylene, phenylsilylene-ethynylene-2,7-naphthylene-ethynylene, phenylsilylene-ethynylene-5,10-anthracenylene-ethynylene, phenylsilylene-ethynylene-4,4'-biphenylene-ethynylene, phenylsilylene-ethynylene-1,4-phenylenemethylene-1',4'-phenylene-ethynylene, phenylsilylene-ethynylene-1,4-phenylene-2,2-propylidene-1',4'-phenylene-ethynylene, phenylsilylene-ethynylene-1,4-phenylene-2,2-(1,1,1,3,3,3-hexafluoropropylidene)-1',4'-phenylene-ethynylene, henylsilylene-ethynylene-1,4-phenyleneoxy-1',4'-phenylene-ethynylene, phenylsilylene-ethynylene-2,5-pyridilene-ethynylene, phenylsilylene-ethynylene-2,5-thiophenylene-ethynylene, methylsilylene-ethynylene methylene-ethynylene, phenylsilylene-1,4-phenylene(phenylsilylene)ethynylene-1',3-phenylene-ethylynylene, phenylsilyleneoxy(phenylsilylene)ethynylene, phenylsilyleneoxy(phenylsilylene)ethynylene-1',4'-phenylene-ethynylene, phenylsilyleneimino(phenylsilylene)ethynylene-1',3'-phenyle ne-ethynylene, phenylsilyleneimino(phenylsilylene)ethynylene-1',4'-phenyle ne-ethynylene, silylene-1,3-phenylene-ethynylene, silylene-1,4-phenylene-ethynylene, silylene-1,2-phenylene-ethynylene, phenylsilylene-1,3-phenylene-ethynylene, phenylsilylene-1,4-phenylene-ethynylene, phenylsilylene-1,2-phenylene-ethynylene, diphenylsilylene-1,3-phenylene-ethynylene, methylsilylene-1,3-phenylene-ethynylene, methylsilylene-1,4-phenylene-ethynylene, methylsilylene-1,2-phenylene-ethynylene, dimethylsilylene-1,3-phenylene-ethynylene, diethylsilylene-1,3-phenylene-ethynylene, phenylsilylene-1,3-butadiylene, diphenylsilylene-1,3-butadiylene, phenylsilylene-methylene-ethynylene, diphenylsilylene-methylene-ethynylene-methylene, phenylsilylene-methylene-ethynylene-methylene, silylene-1,4-phenylene-ethynylene-1',4'-phenylene, methylsilylene-1,4-phenylene-ethynylene-1',4'-phenylene, dimethylsilylene-1,4-phenylene-ethynylene-1',4'-phenylene, and phenylsilylene-1,4-phenylene-ethynylene-1',4'-phenylene.

Although there are no specific limitations, the average molecular weight of the organic. silicon polymer of the formula (1) is preferably 500-500,000. These silicon-containing polymer compounds are solid or liquid at the atmospheric temperature.

The method for producing the organosilicon polymer of the formula (1) includes, but is not limitedto, dehydrogenation copolymerization of a diethynyl compound and a silane compound using a basic oxide, metal hydride, or a metal compound as a catalyst (Japanese Patent Applications Laid-open No. 7-90085, No. 10-120689, and No. 11-158187), dehydrogenation polymerization of an ethynyl silane compound using a basic oxide as a catalyst (Japanese Patent Application Laid-open No. 9-143271), a method of reacting an organomagnesium reagent with a dichlorosilane (Japanese Patent Applications Laid-open No. 7-102069 and No. 11-029579), dehydrogenation copolymerization of a diethynyl compound and a silane compound using a cuprous chloride and tertiary amine as a catalyst (Hua Qin Liu and John F. Harrod, The Canadian Journal of Chemistry, Vol. 68, 1100-1105 (1990)), and dehydrogenation copolymerization of a diethynyl compound and a silane compound using magnesium oxide as a catalyst (Japanese Patent Applications Laid-open No. 7-90085 and No. 10-204181).

(II) Organic Solvent

The film-forming composition of the present invention is a solution or dispersion of the organosilicon polymer (I) in an organic solvent (II).

As the organic solvent (II), at least one solvent selected from the group consisting of ketone solvents, amide solvents, ether solvents, ester solvents, aliphatic hydrocarbon solvents, aromatic solvents, and halogen-containing solvents can be used.

As ketone solvents, acetone, methyl ethyl ketone, methyl n-propyl ketone, methyl n-butyl ketone, diethyl ketone, methyl i-butyl ketone, methyl n-pentyl ketone, ethyl n-butyl ketone, methyl n-hexyl ketone, di-i-butyl ketone, trimethylenonane, cyclopentanone, cyclohexanone, cycloheptanone, cyclo octanone, 2-hexanone, methyl cyclohexanone, 2,4-pentane dione, acetonyl acetone, diacetone alcohol, acetophenone, fenchone, and the like can be given.

These ketone solvents may be used either individually or in combination of two or more.

As the amide solvent, nitrogen-containing solvents such as N,N-dimethylimidazolidinone, N-methylformamide, N,N-dimethylformamide, N,N-dimethylformamide, acetamide, N-methylacetamide, N,N-dimethylacetamide, N-methylpropioneamide, N-methylpyrrolidone, and the like can be given.

These amide solvents may be used either individually or in combination of two or more.

As ether solvents, ethyl ether, i-propyl ether, n-butyl ether, n-hexyl ether, 2-ethylhexyl ether, ethylene oxide, 1,2-propylene oxide, dioxolane, 4-methyl dioxolane, dioxane, dimethyl dioxane, ethylene glycol monomethyl ether, ethylene glycol dimethyl ether, ethylene glycol monoethyl ether, ethylene glycol diethyl ether, ethylene glycol mono-n-butyl ether, ethylene glycol mono-n-hexyl ether, ethylene glycol monophenyl ether, ethylene glycol mono-2-ethyl butyl ether, ethylene glycol dibutyl ether, diethylene glycol monomethyl ether, diethylene glycol dimethyl ether, diethylene glycol monoethyl ether, diethylene glycol diethyl ether, diethylene glycol mono-n-butyl ether, diethylene glycol di-n-butyl ether, diethylene glycol mono-n-hexyl ether, ethoxy triglycol, tetraethylene glycol di-n-butyl ether, propylene glycol monomethyl ether, propylene glycol monoethyl ether, propylene glycol monopropyl ether, propylene glycol monobutyl ether, dipropylene glycol monomethyl ether, dipropylene glycol monoethyl ether, tripropylene glycol monomethyl ether, tetrahydrofuran, 2-methyltetrahydrofuran, diphenyl ether, anisole, and the like can be given.

These ether solvents may be used either individually or in combination of two or more.

As ester solvents, diethyl carbonate, propylene carbonate, methyl acetate, ethyl acetate, γ-butyrolactone, γ-valerolactone, n-propyl acetate, i-propyl acetate, n-butyl acetate, i-butyl acetate, sec-butyl acetate, n-pentyl acetate, sec-pentyl acetate, 3-methoxybutyl acetate, methylpentyl acetate, 2-ethylbutyl acetate, 2-ethylhexyl acetate, benzyl acetate, cyclohexyl acetate, methylcyclohexyl acetate, n-nonyl acetate, methyl acetoacetate, ethyl acetoacetate, ethylene glycol monomethyl ether acetate, ethylene glycol monoethyl ether acetate, diethylene glycol monomethyl ether acetate, diethylene glycol monoethyl ether acetate, diethylene glycol mono-n-butyl ether acetate, propylene glycol monomethyl ether acetate, propylene glycol monoethyl ether acetate, propylene glycol monopropyl ether acetate, propylene glycol monobutyl ether acetate, dipropylene glycol monomethyl ether acetate, dipropylene glycol monoethyl ether acetate, glycol diacetate, methoxy triglycol acetate, ethyl propionate, n-butyl propionate, i-amyl propionate, diethyl oxalate, di-n-butyl oxalate, methyl lactate, ethyl lactate, n-butyl lactate, n-amyl lactate, diethyl malonate, dimethyl phthalate, diethyl phthalate, and the like can be given.

These ester solvents may be used either individually or in combination of two or more.

As the aliphatic hydrocarbon solvent, n-pentane, i-pentane, n-hexane, i-hexane, n-heptane, i-heptane, 2,2,4-trimethylpentane, n-octane, i-octane, cyclohexane, methylcyclohexane, and the like can be given.

These aliphatic hydrocarbon solvents may be used either individually or in combination of two or more.

As the aromatic hydrocarbon solvent, benzene, toluene, xylene, ethylbenzene, trimethylbenzene, methylethylbenzene, n-propylebenzene, i-propylebenzene, diethylbenzene, i-butylbenzene, triethylbenzene, di-i-propylbenzene, n-amylnaphthalene, trimethylbenzene, and the like can be given.

These aliphatic hydrocarbon solvents may be used either individually or in combination of two or more.

As examples of the halogen-containing solvent, dichloromethane, chloroform, flon, chlorobenzene, dichlorobenzene, and the like can be given.

An organic solvent with a boiling point of 250° C. or less is preferable in the present invention. As the type of solvent, ketones, esters, and aromatic hydrocarbons solvents are particular preferable. Either one type or two or more types among these solvents may be preferably used.

(III) Other Additives

The film-forming composition of the present invention may further comprise other components such as a curing promoter, colloidal silica, colloidal alumina, organic polymer (B), surfactant, silane coupling agent, and triazene compound.

As the curing promoter, an organic peroxide can be used. As specific examples of the organic peroxide, BPO (benzoyl peroxide), Pertetra A, Percumyl D (dicumyl peroxide), BTTB (3,3',4,4'-tetrabutylperoxycarbonyl benzophenone) (all manufactured by NOF Corporation), and the like can be given. Organic azo compounds such as 2,2'-azobisisobutyronitrile (AIBN), dimethyl-2,2'-azobis(2-methylpropionate) (V-601, manufactured by Wako Pure Chemical Industries, Ltd.), 1,1'-azobis(l-acetoxy-1-phenylethane) (OT(azo)-15, manufactured by the Otsuka Chemical Co., Ltd.), and the like are also effective.

The amount of the curing agent to be added is usually 0.1-50 parts by weight, and preferably 1-30 parts by weight, for 100 parts by weight of the film-forming composition.

Colloidal silica is a dispersion of high purity silicic anhydride in a hydrophilic organic solvent, for example, with a solid content of about 10-40 wt %, wherein silica particles with an average diameter of 5-30 μm, and preferably 10-20 μm, are dispersed. Such colloidal silica is commercially available, for example, as methanol silica sol or iso-propanol silica sol (manufactured by Nissan Chemical Industries, Ltd.) or Oscal™ (manufactured by Catalysts & Chemicals Ind. Co., Ltd.).

The above colloidal alumina is commercially available, for example, as Alumina Sol 520™, Alumina Sol 100™, or Alumina Sol 200™ (manufactured by Nissan Chemical Industries, Ltd.), and Alumina Clear Sol™, Alumina Sol 10™, or Alumina Sol 132™ (manufactured by Kawaken Fine Chemicals Co., Ltd.).

As examples of the organic polymer (B), compounds with a sugar chain structure, vinyl amide polymers, (meth)acrylic polymers, aromatic vinyl compound polymers, dendolimers, polyimides, polyamic acids, polyarylenes, polyamides, polyquinoxalines, polyoxadizoles, fluorine-containing polymers, compounds with a polyalkylene oxide structure, and the like can be given.

As the polyalkylene oxide structure, a polymethylene oxide structure, polyethylene oxide structure, polypropylene oxide structure, polytetramethylene oxide structure, polybutylene oxide structure, and the like can be given.

Specific examples of the compound having a polyalkylene oxide structure include ether compounds such as polyoxymethylene alkyl ether, polyoxyethylene alkyl ether, polyoxyethylene alkylphenyl ether, polyoxyethylene sterol ether, polyoxyethylene lanolin derivatives, ethylene oxide derivatives of alkylphenol formalin condensate, polyoxyethylene polyoxypropylene block copolymers, and polyoxyethylene polyoxypropylene alkyl ethers; ether-ester compounds such as polyoxyethylene glyceride, polyoxyethylene sorbitan fatty acid ester, polyoxyethylene sorbitol fatty acid ester, and polyoxyethylene fatty acid alkanolamide sulfate; and ester compounds such as polyethylene glycol fatty acid ester, ethylene glycol fatty acid ester, fatty acid monoglyceride, polyglycerol fatty acid ester, sorbitan fatty acid ester, propylene glycol fatty acid ester, and sucrose fatty acid ester.

As a polyoxyethylene polyoxypropylene block copolymer, the compounds having the following block structure can be given:

wherein X' indicates a group —CH$_2$CH$_2$O—, Y' indicates a group —CH$_2$CH(CH$_3$)O—, l is an integer of 1-90, m is an integer of 10-99, and n is an integer of 0-90.

Of these, ether-type compounds such as polyoxyethylene alkyl ethers, polyoxyethylene polyoxypropylene block copolymers, polyoxyethylene polyoxypropylene alkyl ethers, polyoxyethylene glycerides, polyoxyethylene sorbitan fatty acid esters, polyoxyethylene sorbitol fatty acid esters, and the like are preferable.

These organic compounds can be used either individually or in combination of two or more.

As examples of surfactants, nonionic surfactants, anionic surfactants, cationic surfactants, and amphoteric surfactants can be given. These may be a fluorine-containing surfactant, silicon-containing surfactant, polyalkylene oxide surfactant, poly(meth)acrylate surfactant, or the like. Of these, fluorine-containing surfactants and silicon-containing surfactants are preferable.

As examples of fluorine-containing surfactants, compounds having a fluoroalkyl or fluoroalkylene group at the molecular chain terminal, or in the main chain or side chain can be given. Specific examples of such compounds are 1,1,2,2-tetrafluorooctyl(1,1,2,2-tetrafluoropropyl)ether, 1,1,2,2-tetrafluorooctylhexyl ether, octaethylene glycol di(1,1,2,2-tetrafluorobutyl)ether, hexaethylene glycol (1,1,2,2,3,3-hexafluoropentyl)ether, octapropylene glycol di(1,1,2,2-tetrafluorobutyl)ether, hexapropylene glycol di(1,1,2,2,3,3-hexafluoropentyl)ether, sodium perfluorododecyl sulfonate, 1,1,2,2,8,8,9,9,10,10-decafluorododecane, 1,1,2,2,3,3-hexafluorodecane, N-3-(perfluorooctanesulfonamide)-propyl-N,N'-dimethyl-N-car boxymethylene ammonium betaine, perfluoroalkyl sulfonamide propyltrimethyl ammonium salt, perfluoroalkyl-N-ethylsulfonyl glycine salt, bis(N-perfluorooctylsulfonyl-N-ethylaminoethyl)phosphate, and monoperfluoroalkylethyl phosphate.

As examples of commercially available products of fluorine-containing surfactants, MEGAFAC F142D, F172, F173, F183 (manufactured by Dainippon Ink and Chemicals, Inc.), Eftop EF301, EF303, EF352 (manufactured by Sin-Akita Kasei Co., Ltd.). Fluorad FC-430, FC-431 (manufactured by Sumitomo 3M Co., Ltd.), Asahi Guard AG710, Surflon S-382, SC-101, SC-102, SC-103, SC-104, SC-105, SC-106 (manufactured by Asahi Glass Co., Ltd.), BM-1000, BM-1100 (manufactured by BM Chemie), and NBX-15 (manufactured by NEOS Co., Ltd.) can be given. Of these products, MEGAFAC F172, BM-1000, BM-1100, and NBX-15 are particularly preferable.

As silicon-containing surfactants, SH7PA, SH21PA, SH28PA, SH30PA, ST94PA (manufactured by Toray-Dow Corning Silicone Co., Ltd.) and the like can be used. Of these, SH28PA and SH30PA are particularly preferable.

The amount of surfactant to be added is usually 0.00001-1 part by weight for 100 parts by weight of the polymers (I) and (II).

These surfactants can be used either individually or in combination of two or more.

As examples of silane coupling agents, 3-glycidyloxypropyltrimethoxysilane, 3-aminoglycidyloxypropyltriethoxysilane, 3-methacryloxypropyltrimethoxysilane, 3-glycidyloxypropylmethyldimethoxysilane, 1-methacryloxypropylmethyldimethoxysilane, 3-aminopropyltrimethoxysilane, 3-aminopropyltriethoxysilane, 2-aminopropyltrimethoxysilane, 2-aminopropyltriethoxysilane, N-(2-aminoethyl)-3-aminopropyltrimethoxysilane, N-(2-aminoethyl)-3-aminopropylmethyldimethoxysilane, 3-ureidopropyltrimethoxysilane, 3-ureidopropyltriethoxysilane, N-ethoxycarbonyl-3-aminopropyltrimethoxysilane, N-ethoxycarbonyl-3-aminopropyltriethoxysilane, N-triethoxysilylpropyltriethylenetriamine, N-triethoxysilylpropyltriethylenetriamine, 10-trimethoxysilyl-1,4,7-triazadecane, 10-triethoxysilyl-1,4,7-triazadecane, 9-trimethoxysilyl-3,6-diazanonylacetate, 9-triethoxysilyl-3,6-diazanonylacetate, N-benzyl-3-aminopropyltrimethoxysilane, N-benzyl-3-aminopropyltriethoxysilane, N-phenyl-3-aminopropyltrimethoxysilane, N-phenyl-3-aminopropyltriethoxysilane, N-bis(oxyethylene)-3-aminopropyltrimethoxysilane, and N-bis(oxyethylene)-3-aminopropyltriethoxysilane can be given.

These silane coupling agents can be used either individually or in combination of two or more.

As examples of triazene compounds, 1,2-bis(3,3-dimethyltriazenyl)benzene, 1,3-bis(3,3-dimethyltriazenyl)benzene, 1,4-bis(3,3-dimethyltriazenyl)benzene, bis(3,3-dimethyltriazenylphenyl)ether, bis(3,3-dimethyltriazenylphenyl)methane, bis(3,3-dimethyltriazenylphenyl)sulfone, bis(3,3-dimethyltriazenylphenyl)sulfide, 2,2-bis[4-(3,3-dimethyltriazenylphenoxy)phenyl]-1,1,1,3,3,3-hexafluoropropane, 2,2-bis[4-(3,3-dimethyltriazenylphenoxy)phenyl]propane, 1,3,5-tris(3,3-dimethyltriazenyl)benzene, 2,7-bis(3,3-dimethyltriazenyl)-9,9-bis[4-(3,3-dimethyltriazenyl)phenyl]fluorene, 2,7-bis(3,3-dimethyltriazenyl)-9,9-bis[3-methyl-4-(3,3-dimethyltriazenyl)phenyl]fluorene, 2,7-bis(3,3-dimethyltriazenyl)-9,9-bis[3-phenyl-4-(3,3-dimethyltriazenyl)phenyl]fluorene, 2,7-bis(3,3-dimethyltriazenyl)-9,9-bis[3-propenyl-4-(3,3-dimethyltriazenyl)phenyl]fluorene, 2,7-bis(3,3-dimethyltriazenyl)-9,9-bis[3-fluoro-4-(3,3-dimethyltriazenyl)phenyl]fluorene, 2,7-bis(3,3-dimethyltriazenyl)-9,9-bis[3,5-difluoro-4-(3,3-dimethyltriazenyl)phenyl]fluorene, and 2,7-bis(3,3-dimethyltriazenyl)-9,9-bis[3-trifluoromethyl-4-(3,3-dimethyltriazenyl)phenyl]-fluorene can be given.

These triazene compounds can be used either individually. or in combination of two or more.

The total solid content in the film-forming composition of the present invention may be appropriately adjusted according to the target application, preferably, in the range of 1-30 wt %. The total solid content in the range of 1-30 wt % not only ensures production of a coated film thickness in an appropriate range, but also ensures excellent storage stability of the composition.

When the composition of the present invention is applied to a substrate, a coating method such as spin coating, dip coating, roll coating, spray coating, or scan coating can be used.

A coated film with a dry thickness of about 0.01-1.5 μm is obtained by a single application, and about 0.2-3 μm is obtained by one additional application of the composition of the present invention. The coated film is then dried at an ordinary temperature or by heating at about 80-600° C. for 5-240 minutes, thereby forming the coated film (cure film) that can be used as an interlayer dielectric film. A hot plate, oven, furnace, or the like can be used for heating the coated film in air, in nitrogen or argon, under vacuum, or under reduced pressure in which the oxygen concentration is controlled. In particular, if heated at 100-450° C. for 1-240 minutes in the presence of oxygen, a three-dimensional cross-linking structure in which oxygen atoms are introduced in carbosilane can be formed. If the three-dimensional cross-linking structure is formed, the polycarbosilane becomes insoluble in solvents and is maintained stable during a fabrication process with heating or the like. The three-dimensional cross-linking structure can also be formed by adding a peroxide, diazo compound, or the like to the coating composition and heating the composition instead of curing in the presence of oxygen. The coated film can also be cured by irradiating with active energy rays such as electron beams or ultraviolet rays.

The organosilicon polymer can be preferably used in combination with a silicon oxide-based interlayer dielectric film such as silicon oxide ($SiO_2$), fluorine-doped silicon oxide (FSG), organosilicate glass (OCG), carbon-doped silicon oxide (SiOC), methyl silsesquioxane (MSQ), hydrogen silsesquioxane (HSQ), spin-on-glass (SOG), or polyorganosiloxane or in combination with an organic polymer (A)-based interlayer dielectric film made from the organic polymer (A) such as polyarylene, polyarylene ether, polyimide, or fluororesin. The silicon oxide-based interlayer dielectric film and organic polymer (A)-based interlayer dielectric film are herein collectively referred to from time to time as the "interlayer dielectric film."

The organosilane polymer of the present invention has polycarbosilane in the skeleton and exhibits a dry etching speed of 1/3 at most, generally 1/5 or less, of the dry etching speed of the silicon oxide-based interlayer dielectric film and the organic polymer (A)-based interlayer dielectric film under the plasma dry etching conditions. Specifically, the organosilane polymer has a dry etching selection ratio to the silicon oxide-based interlayer dielectric film and the organic polymer (A)-based interlayer dielectric film of 1/3 or less, and generally 1/5 or less. Therefore, the organosilane polymer of the present invention can function as an etching stopper or a hard mask.

In the present invention, the organosilicon polymer functions as an etching stopper when formed under the interlayer dielectric film and as a hard mask when formed on the interlayer dielectric film.

Methods for forming the etching stopper, hard mask, and damascene structure will now be described in detail.

Etching Stopper

When the interlayer dielectric film is etched by an etching process, the interlayer dielectric film is first formed on the etching stopper and a mask film having openings is formed on this interlayer dielectric film to give a laminated structure. Various methods can be used for forming openings in the mask film. One method of forming openings in the mask film is a lithographic technique using visible rays, ultraviolet rays, or electron beams and a photosensitive polymer (photoresist).

A specific pattern can be formed on the interlayer dielectric film by etching the interlayer dielectric film through the openings in the mask film. Either wet etching or dry etching can be applied to etching the interlayer dielectric film. An electric circuit pattern is given as an example of the specific pattern formed on the interlayer dielectric film.

The etching speed is preferably the same at any point on the interlayer dielectric film. However, the etching speed may vary by location due to unevenness in the etching gas concentration, flow rate, temperature, and the like in the case of dry etching and due to unevenness in the concentration and convection of the etching solution and unevenness in the temperature in the case of wet etching. For this reason, if the etching time at the location where the etching speed is the slowest is applied, the etching gas or the etching solution reaches the lowest layer of the interlayer dielectric film all over the film except for the location where the etching speed is the slowest and chemically reacts with the materials existing below the interlayer dielectric film.

If an etching stopper is formed under the interlayer dielectric film, the chemical reaction due to the etching gas or the etching solution in the layer below the etching stopper can be prevented. If the speed to etch the etching stopper is slower than the speed to etch the interlayer dielectric film, the thickness of the etching stopper to prevent the etching gas or the etching solution from chemically reacting with the materials existing below the interlayer dielectric film can be reduced. For example, when a low induction insulating film is used as the interlayer dielectric film, a thin etching stopper is desirable since the relative dielectric constant of the interlayer dielectric film is larger than that of the etching stopper.

Hard Mask

In the case where the etching selection ratio of the interlayer dielectric film to the photoresist is insufficient, the case where the photoresist film thickness is too thin to resist etching of the interlayer dielectric film, and other similar cases, the opening pattern in the photoresist is transcripted onto a hard mask with a high etching selection ratio and the etching operation is carried out using the opening pattern on the hard mask.

In this case, a hard mask is formed on the interlayer dielectric film. A mask film with openings is further formed on the hard mask to give a laminated structure. Various methods can be used for forming openings in the mask film. One method of forming the openings in the mask film is a lithographic technique using visible rays, ultraviolet rays, or electron beams and a photoresist.

A specific pattern can be formed on the hard mask by etching the hard mask through the openings in the mask film. Either wet etching or dry etching can be applied to etching the hard mask. An electric circuit pattern is given as an example of the specific pattern formed on the hard mask. After removing the photoresist by means of a dry method (ashing) or wet method (wet delamination), the interlayer dielectric film is etched using the circuit pattern transcripted onto the hard mask as a mask.

Damascene Structure Forming Method

The damascene structure is formed by forming a pattern of trenches and via-holes in the interlayer dielectric film, filling a circuit metal in the trenches and via-holes, and removing excessive metal by the chemical machine polishing (CMP) method. There are two methods for forming a damascene structure. One is a single damascene forming method wherein trenches and holes are separately formed, filled with a metal, and polished by CMP and the other is a dual damascene forming method wherein the process of forming trenches and holes, filling them with the metal, and polishing by the CMP is carried out simultaneously only one time for the trenches and holes.

Figure 1:
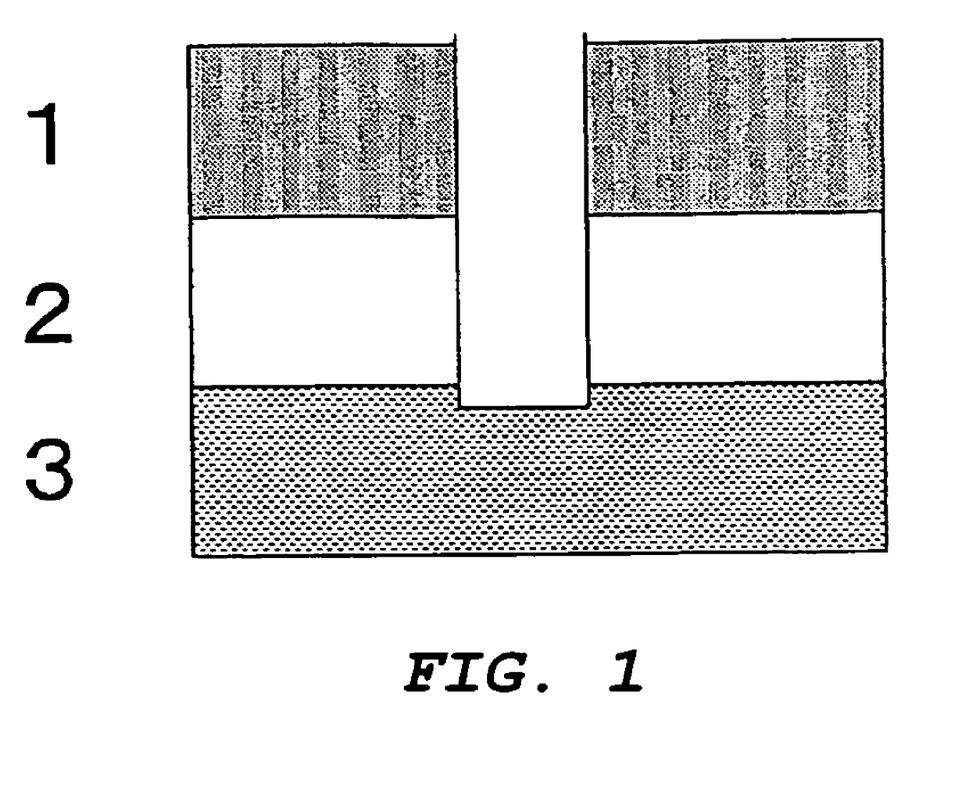
FIG. 1 is a drawing schematically showing a structure of an etching stopper.
Figure 2:
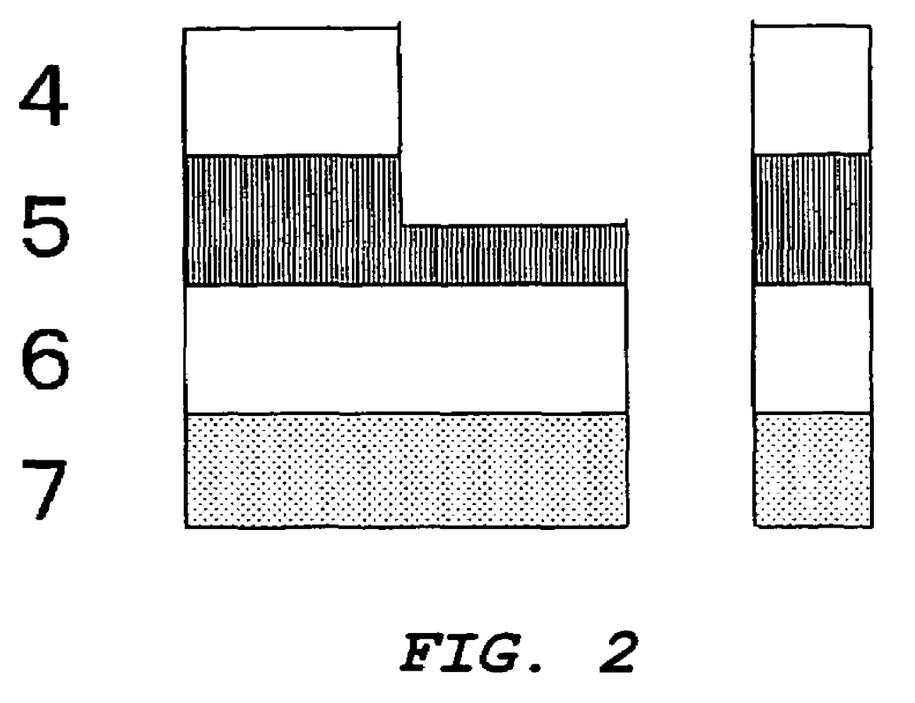
FIG. 2 is a drawing schematically showing a dual damascene structure.

The structure obtained by the dual damascene forming method of the present invention is characterized by being composed of two insulating film layers with a layer functioning as both the etching stopper and the hard mask interposed between them. (see FIG. 2) Such a laminated structure can be obtained by sequentially laminating the interlayer dielectric film formed by the plasma CVD method or the coating method, the etching stopper film formed by the plasma CVD method or the coating method, and the interlayer dielectric film formed by the plasma CVD method or the coating method. Wiring trenches are formed in the first and second interlayer dielectric films by photolithographic and etching processes. A uniform surface can be obtained more easily with an increased etching process allowance by interposing the etching stopper film between the first and second interlayer dielectric films. Via-holes can be formed in the second interlayer dielectric film by transcripting the via-hole pattern onto the etching stopper film.

Wiring for a circuit can be formed in the laminated structure after the photolithographic and etching processes by forming damascene grooves and/or via-holes, coating the damascene grooves and/or via-holes with a barrier metal, and filling the grooves and/or via-holes with copper.

The etching stopper obtained in this manner is useful for fabricating semiconductors such as LSI, system LSI, MPU, CPU, DRAM, SDRAM, RDRAM, and D-RDRAM due to its excellent resistance to the etching process.

EXAMPLES

The present invention will be described in more detail by way of examples.

In the following examples and comparative examples, "parts" and "%" respectively refer to "parts by weight" and "wt %" unless otherwise indicated.

The film-forming compositions in the examples were evaluated using the following method.

Weight Average Molecular Weight (Mw)

Mw was measured by gel permeation chromatography (GPC) under the following conditions.

Samples: 1 g of the sample was dissolved in 100 cc of tetrahydrofuran.

Standard polystyrene: Standard polystyrene manufactured by Pressure Chemical Co. of the U.S. was used.

Apparatus: A high temperature high-speed gel osmosis chromatogram (Model 150-CALC/GPC™) manufactured by Waters Co. of the U.S.

Column: SHODEX A-80M™ (length: 50 cm) manufactured by Showa Denko K.K.

Temperature: 40° C.

Flow rate: 1 cc/min.

Etching Selection Ratio

Coated films were etched using an etching apparatus, Unity II, manufactured by Tokyo Electron Co., Ltd.

An etching stopper formed on a silicon wafer was etched using the etching apparatus to determine the thickness (thickness A) that can be etched within a unit period of time. An insulating film formed on a silicon wafer was etched using the above etching apparatus under the same conditions as applied to the etching stopper to determine the thickness (thickness B) that can be etched within a unit period of time. The quotient B/A was evaluated as the etching selection ratio.

Synthesis Example 1

Synthesis of Organosilicon Polymer

Poly(phenylsilylene-ethynylene-1,3-phenylene-ethynylene) was dissolved in cyclohexanone to obtain a 15 wt % solution.

The solution (1) was filtered through a Teflon filter with 0.2 μm pore size to measure the relative dielectric constant of the coating film. The relative dielectric constant was 3.0.

Synthesis Example 2

Synthesis of Silicon Oxide Interlayer Dielectric Film 77.04 g of methyltrimethoxysilane, 24.05 g of tetramethoxysilane, and 0.48 g of tetrakis(acetylacetonate) titanium were dissolved in 290 g of propylene glycol monopropyl ether in a separable quartz flask. The solution was stirred using a three-one motor and the temperature of the liquid was stabilized at 60° C. Next, 84 g of ion exchanged water was added to the solution over one hour. After reacting the mixture for two hours at 60° C., 25 g of acetylacetone was added. The resulting mixtures was reacted for 30 minutes and cooled to room temperature. 149 g of a solution containing methanol and water was removed by evaporation at 50° C.

The weight average molecular weight of the resulting hydrolysis condensate (either the hydrolyzate or its condensate or both) was 8,900.

Example 1

The etching selection ratio of the etching stopper film made from the organosilicon polymer synthesized in Synthesis Example 1 was evaluated using the above silicon oxide interlayer dielectric film polycarbosilane synthesized in Synthesis Example 2 as an insulating film. An etching apparatus Unity II (manufactured by Tokyo Electron Ltd.) was used under the etching conditions shown in Table 1. The results of the etching selection ratio are shown in Table 1.

TABLE 1

| Etching conditions | A | B | C | D |
|---|---|---|---|---|
| Etching gas | $C_4F_8/Ar/N_2$ | $C_4F_8/Ar$ | $CF_4/Ar/N_2$ | $CF_4/Ar$ |
| Pressure | 10 Pa | 10 Pa | 10 Pa | 10 Pa |
| Etching time | 20 seconds | 20 seconds | 20 seconds | 20 seconds |
| Etching selection ratio | 6.0 | 5.8 | 6.3 | 7.8 |

A coating film (interlayer dielectric film material) for semiconductor with only minimal damages produced by the etching process can be obtained by using the etching stopper or hard mask made from the organosilicon polymer having a relative dielectric constant of 4 or less of the present invention. In addition, excellent precision can be ensured with a reduced actual dielectric constant after the wiring process in manufacturing semiconductor devices.

Obviously, numerous modifications and variations of the present invention are possible in light of the above teachings. It is therefore to be understood that, within the scope of the appended claims, the invention may be practiced otherwise than as specifically described herein.

The invention claimed is:

1. An insulation film having a thickness of from about 0.01 to 3 μm, and comprising an organosilicon polymer with a relative dielectric constant of 4 or less having a dry etching selection ratio to the compound selected from the group consisting of silicon oxide, fluorine-doped silicon oxide, organosilicate glass, carbon-doped silicon oxide, methyl silsesquioxane, hydrogen silsesquioxane, a spin-on-glass, polyorganosiloxane, and an organic polymer selected from the group consisting of polyarylene, polyarylene ether, polyimide, and fluororesin, wherein the organosilicon polymer is at least one polycarbosilane selected from the group consisting of polymers having the structural unit of the following formula (1),

(1)

wherein $R^1$ and $R^2$ independently represent a hydrogen atom, an alkyl group having 1-30 carbon atoms that may have a substituent, an alkenyl group having 1-30 carbon atoms that may have a substituent, an alkynyl group having 1-30 carbon atoms that may have a substituent, or an aromatic group that may have a substituent and $R^3$ represents —C≡C—, —$CH_2$— or fluoro-substituted —$CH_2$— having a substituent linked with at least one —C≡C— group, an alkylene or fluoro-substituted alkylene group having 2-30 carbon atoms and having a substituent linked with at least one —C≡C— group, an alkenylene group having 2-30 carbon atoms and having a substituent linked with at least one —C≡C— group, an alkynylene group having 2-30 carbon atoms and having a substituent linked with at least one —C≡C— group, or a divalent aromatic group having 6-30 carbon atoms and having a substituent linked with at least one —C≡C— group.

2. The insulation film according to claim 1, wherein the dry etching selection ratio is 1/3 or less.

3. A coating solution composition comprising (I) at least one polycarbosilane selected from the group consisting of polymers having the structural unit of the following formula (1), (1)

wherein R¹ and R² independently represent a hydrogen atom, an alkyl group having 1-30 carbon atoms that may have a substituent, an alkenyl group having 1-30 carbon atoms that may have a substituent, an alkynyl group having 1-30 carbon atoms that may have a substituent, or an aromatic group that may have a substituent and R³ represents —C≡C—, —CH₂— or fluoro-substituted —CH₂— having a substituent linked with at least one —C≡C— group, an alkylene or fluoro-substituted alkylene group having 2-30 carbon atoms and having a substituent linked with at least one —C≡C— group, an alkenylene group having 2-30 carbon atoms and having a substituent linked with at least one —C≡C— group, an alkynylene group having 2-30 carbon atoms and having a substituent linked with at least one —C≡C— group, or a divalent aromatic group having 6-30 carbon atoms and having a substituent linked with at least one —C≡C— group, and at least one additive selected from the group consisting of colloidal silica, colloidal alumina, an organic polymer other than the organosilicon polymer, a surfactant, silane coupling agent, and triazene compound, wherein the other polymer is at least one polymer selected from the group consisting of compounds with a sugar chain structure, vinyl amide polymers, (meth)acrylic polymers, aromatic vinyl compound polymers, dendolimers, polyimides, polyamic acids, polvarvlene, polvamides, polyquinoxalines, polyoxadizoles, fluorine-containing polymers, and compounds with a polyalkylene oxide structure, and (II) an organic solvent.

4. A method of forming an insulating film comprising applying the coating solution composition of claim 3 to a substrate and heating the applied composition.

5. A method of forming an insulating film comprising applying the coating solution composition of claim 3 to a substrate and heating the applied composition in the presence of oxygen or peroxide to three-dimensionally crosslink the composition.

6. An etching stopper comprising the insulation film described in claim 1 formed below an upper layer film comprising a compound selected from the group consisting of silicon oxide, fluorine-doped silicon oxide, organosilicate glass, carbon-doped silicon oxide, methyl silsesquioxane, hydrogen silsesquioxane, spin-on glass, and polyorganosiloxane or an upper layer film comprising an organic polymer selected from the group consisting of polyarylene, polyarylene ether, polyimide, and fluororesin and having an etch rate of 1/3 or less of the plasma dry etching rate of the upper layer film.

7. A hard mask comprising the insulation film described in claim 1 formed on an under layer film comprising a compound selected from the silicon oxide, fluorine-doped silicon oxide, organosilicate glass, carbon-doped silicon oxide, methyl silsesquioxane, hydrogen silsesquioxane, spin-on glass, and polyorganosiloxane or an under layer film comprising an organic polymer selected from the group consisting of polyarylene, polyarylene ether, polyimide, and fluororesin and having an etch rate of 1/3 or less of the plasma dry etching rate of the under layer film.

8. A method comprising dry etching an insulation film using the etching stopper of claim 6.

9. A method comprising damascene structure processing using the etching stopper of claim 6.

10. A method comprising dual damascene structure processing using the etching stopper of claim 6.

11. A method comprising dry etching an insulation film using the hard mask of claim 7.

12. A method comprising damascene structure processing using the hard mask of claim 7.

13. A method comprising dual damascene structure processing using the hard mask of claim 7.

14. An insulation film comprising an organosilicon polymer with a relative dielectric constant of 4 or less having a dry etching selection ratio to the compound selected from the group consisting of silicon oxide, fluorine-doped silicon oxide, organosilicate glass, carbon-doped silicon oxide, methyl silsesqujoxane, hydrogen silsesquioxane, a spin-on-glass, polyorganosiloxane, and an organic polymer selected from the group consisting of polyarylene, polyarylene ether, polyimide, and fluororesin, wherein the organosilicon polymer is at least one polycarbosilane selected from the group consisting of polymers having the structural unit of the following formula (1), (1)

wherein R¹ and R² independently represent an alkyl group having 1-30 carbon atoms that may have a substituent, an alkenyl group having 1-30 carbon atoms that may have a substituent, an alkynyl group having 1-30 carbon atoms that may have a substituent, or an aromatic group that may have a substituent and R³ represents —C≡C—, —CH₂— or fluoro-substituted —CH₂— having a substituent linked with at least one —C≡C— group, an alkylene or fluoro-substituted alkylene group having 2-30 carbon atoms and having a substituent linked with at least one —C≡C— group, an alkenylene group having 2-30 carbon atoms and having a substituent linked with at least one —C≡C— group, an alkynylene group having 2-30 carbon atoms and having a substituent linked with at least one —C≡C— group, or a divalent aromatic group having 6-30 carbon atoms and having a substituent linked with at least one —C≡C— group.

15. An insulation film comprising an organosilicon polymer with a relative dielectric constant of 4 or less having a dry etching selection ratio to the compound selected from the group consisting of silicon oxide, fluorine-doped silicon oxide, organosilicate glass, carbon-doped silicon oxide, methyl silsesquioxane, hydrogen silsesquioxane, a spin-on-glass, polyorganosiloxane, and an organic polymer selected from the group consisting of polyarylene, polyarylene ether, polyimide, and fluororesin, wherein the organosilicon polymer is at least one polycarbosilane selected from the group consisting of polymers having the structural unit of the following formula (1), (1)

wherein $R^1$ and $R^2$ independently represent a hydrogen atom, an alkyl group having 1-30 carbon atoms that may have a substituent, an alkenyl group having 1-30 carbon atoms that may have a substituent, an alkynyl group having 1-30 carbon atoms that may have a substituent, or an aromatic group that may have a substituent and $R^3$ represents —C≡C—, —CH$_2$— or fluoro-substituted —CH$_2$— having a substituent linked with at least one —C≡C— group, an alkylene or fluoro-substituted alkylene group having 2-30 carbon atoms and having a substituent linked with at least one —C≡C— group, an alkenylene group having 2-30 carbon atoms and having a substituent linked with at least one —C≡C— group, an alkynylene group having 2-30 carbon atoms and having a substituent linked with at least one —C≡C— group, or a divalent aromatic group having 6-30 carbon atoms and having a substituent linked with at least one —C≡C— group, and wherein said insulation film additionally comprises at least one additive selected from the group consisting of colloidal silica, colloidal alumina, an organic polymer other than the organosilicon polymer, a surfactant, silane coupling agent, and triazene compound, wherein the other polymer is at least one polymer selected from the group consisting of compounds with a sugar chain structure, vinyl amicle polymers, (meth)acrylic polymers, aromatic vinyl compound polymers, dendolimers, polyimides, polyamic acids, polyarylene, polyamides, polyquinoxalines, polyoxadizoles, fluorine-containing polymers, and compounds with a polyalkylene oxide structure.

* * * * *

UNITED STATES PATENT AND TRADEMARK OFFICE
CERTIFICATE OF CORRECTION

PATENT NO. : 7,297,360 B2 Page 1 of 1
APPLICATION NO. : 10/726666
DATED : November 20, 2007
INVENTOR(S) : Mutsuhiko Yoshioka et al.

It is certified that error appears in the above-identified patent and that said Letters Patent is hereby corrected as shown below:

Column 15, line 53: "polvamides" should read --polyamides--

Column 16, line 10: "compound selected from the silicon oxide" should read --compound selected from the group consisting of silicon oxide--

Column 18, line 21: "amicle" should read --amide--

Signed and Sealed this

Twenty Second Day of April, 2008

JON W. DUDAS
*Director of the United States Patent and Trademark Office*